US007956520B2

(12) United States Patent
Shankar et al.

(10) Patent No.: US 7,956,520 B2
(45) Date of Patent: Jun. 7, 2011

(54) ELECTROACTIVE NANOSTRUCTURED POLYMERS AS TUNABLE ORGANIC ACTUATORS

(75) Inventors: Ravi Shankar, Raleigh, NC (US); Tushar K. Ghosh, Cary, NC (US); Richard J. Spontak, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 12/515,761

(22) PCT Filed: Nov. 19, 2007

(86) PCT No.: PCT/US2007/024143
§ 371 (c)(1),
(2), (4) Date: Jan. 6, 2010

(87) PCT Pub. No.: WO2008/063590
PCT Pub. Date: May 29, 2008

(65) Prior Publication Data
US 2010/0141092 A1 Jun. 10, 2010

Related U.S. Application Data

(60) Provisional application No. 60/867,150, filed on Nov. 24, 2006, provisional application No. 60/867,251, filed on Nov. 27, 2006.

(51) Int. Cl.
*H01L 41/08* (2006.01)

(52) U.S. Cl. .......................................................... 310/800

(58) Field of Classification Search .................. 310/800
See application file for complete search history.

(56) References Cited

U.S. PATENT DOCUMENTS

| | | | |
|---|---|---|---|
| 5,954,654 | A | 9/1999 | Eaton et al. |
| 6,231,779 | B1 | 5/2001 | Chiang et al. |
| 6,343,129 | B1 | 1/2002 | Pelrine et al. |
| 6,376,971 | B1 | 4/2002 | Pelrine et al. |
| 6,464,645 | B1 | 10/2002 | Park et al. |
| 6,543,110 | B1 | 4/2003 | Pelrine et al. |
| 6,545,384 | B1 | 4/2003 | Pelrine et al. |
| 6,583,533 | B2 | 6/2003 | Kornbluh et al. |
| 6,586,859 | B2 | 7/2003 | Kornbluh et al. |
| 6,628,040 | B2 | 9/2003 | Pelrine et al. |
| 6,664,718 | B2 | 12/2003 | Pelrine et al. |
| 6,707,236 | B2 | 3/2004 | Pelrine et al. |
| 6,768,246 | B2 | 7/2004 | Pelrine et al. |
| 6,781,284 | B1 | 8/2004 | Pelrine et al. |
| 6,806,621 | B2 | 10/2004 | Heim et al. |
| 6,809,462 | B2 | 10/2004 | Pelrine et al. |
| 6,812,624 | B1 | 11/2004 | Pei et al. |
| 6,876,135 | B2 | 4/2005 | Pelrine et al. |

(Continued)

OTHER PUBLICATIONS

International Search Report, PCT/US2007/024143, mailed Feb. 19, 2008.

*Primary Examiner* — Thomas M Dougherty
(74) *Attorney, Agent, or Firm* — Myers Bigel Sibley & Sajovec, P.A.

(57) ABSTRACT

An actuator element formed from an actuator composition is described, along with transducers including the same. The composition comprises: (i) a thermoplastic elastomer copolymer, the copolymer comprising at least one flexible midblock, and at least two glassy or semicrystalline endblocks; and (ii) a liquid modifier that selectively solvates the at least one flexible midblock.

29 Claims, 3 Drawing Sheets

U.S. PATENT DOCUMENTS

| | | |
|---|---|---|
| 6,882,086 B2 | 4/2005 | Kornbluh et al. |
| 6,891,317 B2 | 5/2005 | Pei et al. |
| 6,911,764 B2 | 6/2005 | Pelrine et al. |
| 6,940,211 B2 | 9/2005 | Pelrine et al. |
| 7,034,432 B1 | 4/2006 | Pelrine et al. |
| 7,049,732 B2 | 5/2006 | Pei et al. |
| 7,052,594 B2 | 5/2006 | Pelrine et al. |
| 7,062,055 B2 | 6/2006 | Pelrine et al. |
| 7,064,472 B2 | 6/2006 | Pelrine et al. |
| 7,110,565 B1 | 9/2006 | Engbert et al. |
| 2001/0020047 A1* | 9/2001 | Lau et al. ............... 522/33 |
| 2005/0162049 A1* | 7/2005 | Krill ............... 310/800 |

* cited by examiner

ELECTROACTIVE NANOSTRUCTURED POLYMERS AS TUNABLE ORGANIC ACTUATORS

RELATED APPLICATIONS

This application is a national phase application of PCT Application PCT/US2007/024143, filed Nov. 19, 2007, and published in English on May 29, 2008, as International Publication No. WO 2008/063590, and which claims the benefit of U.S. Provisional Patent Application Ser. No. 60/867,150, filed Nov. 24, 2006, and of U.S. Provisional Patent Application Ser. No. 60/867,251, filed Nov. 27, 2006, the disclosures of which are incorporated by reference herein in their entirety.

GOVERNMENT SUPPORT

This work was supported by the U.S. Department of Commerce through the National Textiles Center.

FIELD OF THE INVENTION

The present invention concerns actuators comprising electroactive polymers and electromechanical devices incorporating the same.

BACKGROUND OF THE INVENTION

Electroactive polymers (EAPs) are capable of mechanical actuation induced by an external electric field, and thus afford tremendous promise in emerging technologies ranging from micro air vehicles and flat-panel speakers[1]; to active video displays, microrobotics and responsive prosthetics.[2] Some of the key characteristics required in the development of actuator materials include high strain and strain energy density, high fatigue resistance and reliability.[3]

Several classes of materials including single-crystal piezoelectric ceramics[4]; and single-wall carbon nanotubes[5] have been considered as suitable candidates for actuators, but these rigid materials afford relatively low displacement and poor electromechanical coupling in the presence of an electric field.[6] While shape memory alloys can generate high forces and displacements, they generally suffer from slow response times, large mechanical hysteresis and short cycle life.[7]

Electroactive polymers are attractive due to their low cost, light weight, facile processability,[8] favorable power-to-mass ratio and, perhaps most importantly, their potential to emulate biological muscle in terms of resilience, toughness and vibration dampening.[9] Examples of EAPs investigated thus far include electrically conductive polymers,[10,11] electrostrictive polymers,[12] ferroelectric polymers,[3,8] dielectric elastomers' and acidic hydrogels.[13] Of these, dielectric elastomers exhibit the largest actuation strain upon exposure to an electric field, efficiently coupling input electrical energy and output mechanical energy.[14]

Figure 1:
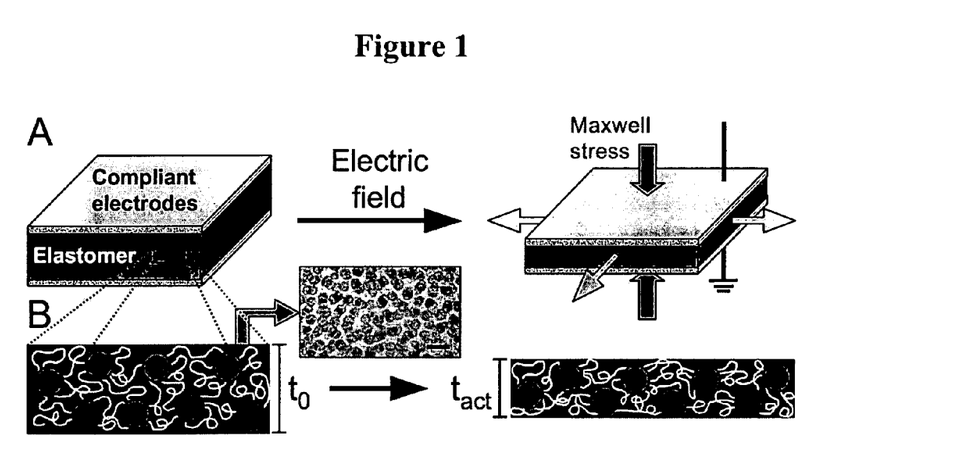
FIG. 1. In (A), the operational principle of a conventional elastomeric EAP before and after actuation. The morphology of a midblock-swollen triblock copolymer micellar network before and after actuation is schematically depicted in (B). A TEM image (scale marker=50 nm) of a solvated copolymer system containing 10 wt % SEBS161, with the S-rich micelles selectively stained by the vapor of $RuO_4$(aq), is included in the inset of (B).

The electromechanical response of dielectric EAPs is attributed to the development of a "Maxwell stress" upon application of an external electrical field.[15] This Maxwell stress arises in response to electrostatic attraction between two oppositely charged conductive surfaces (or electrodes) in contact with the opposing surfaces of a dielectric elastomer film, and generates a dominant uniaxial stress ($\sigma_M$) given by $$\sigma_M = \in_0 \in E^2 \quad (1)$$

where $\in_0$ is the permittivity of free space, $\in$ corresponds to the dielectric constant of the EAP, and E denotes the applied electric field.[1] Since the Maxwell stress acts normal to the film surface, it serves to compress the film along its thickness (z) and stretch the film laterally (along x and y). Repulsive like charges accumulate along both film surfaces and further increase the extent to which the film stretches laterally, as schematically depicted in FIG. 1A.

Three dielectric media that show technological promise derive from homopolymers and include a foamed acrylic adhesive,[1,16] polyurethane[17] and various silicone elastomers.[1,18] The VHB 4910 foamed acrylic adhesive manufactured by 3M Co. (Minneapolis, Minn.) has been reported[1] to exhibit the largest actuation strain in this class of materials.

Independent experimental[19-21] and theoretical[22] studies designed to elucidate the electric field-induced response of another class of macromolecules, microphase-separated block copolymers, have been conducted in an ongoing effort to control nanostructural orientation for various emerging nanotechnologies such as optical waveguides.[23] Linear block copolymers consist of two or more dissimilar homopolymers covalently linked together to form a single macromolecule. If the blocks are sufficiently incompatible, these copolymers spontaneously self-organize into a wide variety of (a) periodic nanostructures alone[24,25] or in the presence of other species.[26-29] Russell and co-workers have established that, due to polarizability differences between the constituent blocks, the lamellar[19] and cylindrical[21] morphologies of poly(styrene-b-methyl methacrylate) block copolymer thin films can be (re)aligned in a dc electric field. Nanostructural alignment in a block copolymer thin film is likewise achieved by annealing the copolymer in solvent vapor, which alters viscosity, interfacial tension and surface segregation.[30] Both strategies have been successfully implemented[31] to align the morphologies of bulk poly(styrene-b-isoprene) (SI) diblock copolymers cast from a neutral, volatile solvent.

Solvated block copolymers are likewise of considerable importance in various technologies ranging from personal care products and pharmaceuticals to shock-absorbing media for fiber optics, novel adhesives and sporting goods.[26]

SUMMARY OF THE INVENTION

A first aspect of the present invention is an actuator element formed from an actuator composition. The composition comprises, consists of or consists essentially of: (i) a thermoplastic elastomer copolymer, the copolymer comprising at least one flexible midblock, and at least two glassy or semicrystalline endblocks; and (ii) a liquid modifier such as an organic solvent (also referred to as an extender, oil or oligomer) that selectively solvates the at least one flexible midblock.

A second aspect of the invention is a transducer useful in an electromechanical device, the transducer comprising: (a) at least one electrode (e.g., one, two, three, four or five or more electrodes); and (b) an actuator element as described herein above and below operatively associated with (e.g., electrically connected to) the at least one electrode.

Stated otherwise, the present invention provides, in a transducer useful in an electromechanical device, and having an actuator element, the improvement comprising utilization of an actuator element formed from an actuator composition as described herein above and below.

In some embodiments, the flexible midblock is a polyolefin or polydiene midblock.

In some embodiments, the flexible midblock is selected from the group consisting of: ethylene-co-butylene, ethylene-co-propylene, ethylene-ethylene-co-propylene, isoprene, butadiene, and derivatives thereof.

In some embodiments, the midblock is rubbery or flexible, indicative of a low-$T_g$ material, where low $T_g$ here refers to a $T_g$ typically, but not strictly, less than 0° C.

In some embodiments, the endblocks are glass-forming (e.g., polymethyl methacrylate) or crystal-forming (e.g., polyester).

In some embodiments, the endblocks are aromatic or acrylic endblocks.

In some embodiments, the endblocks are styrene endblocks, methacrylate endblocks, or derivatives thereof.

Examples of suitable commercial copolymers include but are not limited to: poly[styrene-b-(ethylene-co-butylene)-b-styrene] (SEBS); poly[styrene-b-(ethylene-copropylene)-b-styrene] (SEPS); poly[styrene-b-(ethylene-ethylene-co-propylene)-b-styrene] (SEEPS); poly(styrene-b-isoprene-b-styrene) (SIS); and poly(styrene-b-butadiene-b-styrene) (SBS).

In some embodiments, the solvent comprises an oil having a boiling point greater than 25 or 50° C.

The present invention is explained in greater detail in the drawings herein and the specification set forth below. The disclosures of all United States patents cited herein are to be incorporated by reference herein as if fully set forth.

BRIEF DESCRIPTION OF THE DRAWINGS

FIG. 3. In (A), the maximum areal actuation strain measured for ENPs varying in SEBS161 (●) or SEBS217 (○) copolymer concentration as a function of near-breakdown electric field at 300% biaxial prestrain. The dependence of the electromechanical coupling factor ($K^2$) on copolymer concentration is provided in the inset, with $K^2$ values for other dielectric EAPs (dashed lines) labeled for comparison. The solid lines connect the data in (A). The low-strain tensile behavior (displaying engineering stress) of select ENPs at different copolymer concentrations (in wt %)—30 (solid lines) and 10 (dashed lines)—at ambient temperature is presented in (B). Results obtained from the acrylic foam (heavy dotted line) are included for comparison. The dependence of tensile modulus on copolymer concentration and molecular weight, using the same symbols as in (A), is shown in the inset of (B). The solid lines connect the data. In all cases, the extension rate is 127 mm/min.

FIG. 5. Thickness strain due to electrical actuation ($s_z$) presented as a function of electric field for the dielectric and ferroelectric organic materials displayed in FIG. 4. The cited reference sources are the same as those listed in the caption of FIG. 4 with the exception of the ferroelectric polymer [Klein, R. J., Xia, F., Zhang, Q. M., & Bauer, F., Influence of composition on relaxor ferroelectric and electromechanical properties of poly(vinylidene fluoride-trifluoroethylene-chlorofluoroethylene). *J. Appl. Phys.* 97, 094105 (2005).]. On the basis of its definition, the thickness strain is an inherently negative quantity. The negative sign is routinely omitted in literature reports, and so we adopt this convention here.

DETAILED DESCRIPTION OF THE PREFERRED EMBODIMENTS

Actuator Compositions

Actuator compositions of the present invention can be formed from a variety of components and materials. Indeed an advantage of the present invention is the variety of types, and amounts, of materials that can be utilized to produce the actuator composition to selectively tune the electromechanical properties thereof.

In general, the polymer component comprises a copolymer, particularly block copolymers and preferably at least triblock copolymers (e.g., ABA, ABAB, ABABA, ABC, ABC, ABCAB, ABCABC, ABCD, ABCDA, ABCDAB, ABCDABC, and ABCDABCD block copolymers, etc.).

In general, the copolymer molecular weight should be sufficient for the copolymer to self-organize into a mechanically stable molecular network (commonly referred to as a gel) in the presence of a midblock-selective solvent at a given solvent concentration and temperature.

The modifier, typically an organic solvent (e.g., a solvent comprising an aliphatic organic solvent (the term "aliphatic" including "alicyclic" compounds) is preferably a low volatility solvent, e.g., a solvent having a boiling point of at least 50 or 100° C., or in some embodiments greater than 200° C.

In general, the minimum solvent (e.g., oil) fraction is not critical, and the electroactivity of the copolymer can be tuned by the solvent concentration as shown below.

The midblock that is solvated must be connected to the glassy/crystalline blocks at each end. It should be flexible, that is, it should have a relatively low glass transition temperature ($T_g$) relative to the glassy or semicrystalline endblocks.

Thus the copolymer is preferably a network-forming copolymer that comprises, consists of or consists essentially of at least one flexible, rubbery, or low-$T_g$ midblock that forms a swollen network by forming bridges that are "anchored" on both sides by and therefore serve to connect glassy or semicrystalline aggregates (e.g., micelles) composed of the copolymer endblocks. The network is solvated in the liquid modifier (referred to as solvent, oil or extender), and the aggregates are not solvated at all or to an appreciable extent by the liquid modifier.

Additional additives such as organic and inorganic fillers, co-solvents, other homopolymers or copolymers, pigments, stabilizers, or the like can optionally be included in the actuator compositions if desired.

Thus in some embodiments the actuator composition comprises or consists essentially of a thermoplastic elastomer gel. Thermoplastic elastomer gels are known and described in, for example: van Maanen, G. J., Seeley, S. L., Capracotta, M. D., White, S. A., Bukovnik, R. R., Hartmann, J., Martin, J. D., and Spontak, R. J., "Property and Morphology Development in Nanocomposite Thermoplastic Elastomer Gels," *Langmuir,* 21, 3106 (2005); Wilder, E. A., White, S. A., Smith, S. D., and Spontak, R. J., "Gel Network Development in AB, ABA and AB/ABA Block Copolymer Solutions in a Selective Solvent," in *Polymer Gels: Fundamentals and Applications* (Bohidar, H. B., Dubin, P., and Osada, Y., Eds.) American Chemical Society (Symp. Ser. 833), Washington, D.C., 2002, pp. 248-261; Jackson, N. R., Wilder, E. A., White, S. A., Bukovnik, R., and Spontak, R. J., "Modification of a Thermoplastic Elastomer Gel through the Addition of an Endblock-Selective Homopolymer," *J. Polym. Sci. B: Polym. Phys.,* 37, 1863 (1999); Laurer, J. H., Mulling, J. F., Khan, S. A., Spontak, R. J., Lin, J. S., and Bukovnik, R., "Thermoplastic Elastomer Gels: II. Effects of Composition and Temperature on Morphology and Gel Rheology," *J. Polym. Sci. B: Polym. Phys.,* 36, 2513 (1998); Laurer, J. H., Mulling, J. F., Khan, S. A., Spontak, R. J., and Bukovnik, R., "Thermoplastic Elastomer Gels: I. Effects of Composition and Processing on Morphology and Gel Behavior," *J. Polym. Sci. B: Polym. Phys.,* 36, 2379 (1998); Laurer, J. H., Bukovnik, R., and Spontak, R. J., "Morphological Characteristics of SEBS Thermoplastic Elastomer Gels," *Macromolecules,* 29, 5760 (1996); see also: U.S. Pat. Nos. 6,881,493; 6,692,379; 6,554,752; 6,133,354; and 5,830,136.

In preferred embodiments of the present invention, a thermoplastic elastomer, such as a poly[styrene-b-(ethylene-co-butylene)-b-styrene] (SEBS) triblock copolymer (with glassy S endblocks and a rubbery EB midblock), and a low-volatility aliphatic-rich solvent that selectively swells the EB midblock, are used to form a tunable actuator material. At relatively high solvent concentrations, thermoplastic elastomer systems such as this behave as physical networks wherein dispersed glassy S micelles serve as thermally reversible cross-links.[32] This nanostructure is illustrated in FIG. 1B, and the inset displays a transmission electron microscopy (TEM) image of the S micelles. Organic molecules possessing π-extended functionalities such as the phenyl rings located on the S repeat units of the SEBS copolymer are known to exhibit nonlinear optical properties[33] and, unlike the EB units and the solvent, (without wishing to be bound by any particular theory of the invention) are expected to be polarizable in an electric field.

In preferred embodiments, incorporation of a low-volatility, aliphatic-rich solvent into a nanostructured poly[styrene-b-(ethylene-co-butylene)-b-styrene] (SEBS) triblock copolymer yields physically cross-linked micellar networks that exhibit excellent displacement under an external electric field. Such property development reflects solvent-induced reductions in matrix viscosity and nanostructural order, accompanied by enhanced response of highly polarizable, aromatic-rich micelles to the applied electric field. These synergistic property changes result in ultrahigh areal actuation strains (>200%) at significantly reduced electric fields (<40 V/μm).

Examples of thermoplastic elastomer copolymers used in preferred embodiments include, but are not limited to, poly [styrene-b-(ethylene-co-butylene)-h-styrene] (SEBS); poly [styrene-b-(ethylene-co-propylene)-b-styrene] (SEPS); poly [styrene-b-(ethylene-ethylene-co-propylene)-b-styrene] (SEEPS); poly(styrene-b-isoprene-b-styrene) (SIS); poly (styrene-b-butadiene-b-styrene) (SBS); and derivative block copolymers such as HYBAR™. Higher-order copolymers containing the same chemical repeat units (e.g., SEBSEB or SISIS) may also be used in preferred embodiments of the invention. Also, the invention is not limited to styrenic thermoplastic elastomers. The glassy or semicrystalline blocks may be another glass-former known in the art, e.g., polymethyl methacrylate, or a crystal-former, e.g., polyester.

In preferred embodiments, nanostructured polymers whose properties can be broadly tailored by varying copolymer characteristics or blend composition are provided as an innovative and tunable avenue to reduced-field actuation for advanced engineering, biomimetic and biomedical applications.

In preferred embodiments, the field-induced strain of the nanostructured polymers can be greatly enhanced by decreasing the viscosity of the matrix component and the extent of nanostructural order, while increasing the population of polarizable phenyl rings (i.e., increasing the mass of the S block in the embodiment using a poly[styrene-b-(ethylene-co-butylene)-b-styrene] triblock copolymer).

In preferred embodiments, the viscosity of the matrix component is accomplished by higher solvent loading insofar as network behavior is retained.[32]

In preferred embodiments, increasing the population of polarizable phenyl rings can be achieved by increasing the copolymer molecular weight.

In preferred embodiments, higher elastic moduli are achieved at copolymer concentrations above 30 wt %, and the number-average molecular copolymer weight is less than 161 kDa.

In certain particular embodiments:

the thermoplastic elastomer has a molecular weight greater than 10,000, 20,000, or in some embodiments 50,000, up to 500,000 or more;

the solvent has a molecular weight less than 10,000;

the thermoplastic elastomer is included in said actuator composition in an amount of from 2 or 4 percent by weight, up to 70, 80 or 90 percent by weight or more; and the solvent is included in the actuator composition in an amount of from 90 or 98 percent by weight, down to 30, 20, 10, 2, or 0.5 percent by weight, or less.

Actuator elements, typically shaped or pre-formed articles, can be formed from actuator materials as described above by any suitable or conventional technique for forming articles of thermoplastic materials, including but not limited to extrusion, molding, pultrusion, casting, etc. See, e.g., U.S. Pat. Nos. 7,087,660; 7,037,562; 6,955,735; 6,770,089;

Devices.

Actuators of the present invention, and electromechanical devices comprising the same, can be produced in accordance with known techniques or variations thereof that will be apparent to those skilled in the art given the instant disclosure. The materials can be incorporated into actuators in a variety of ways, including but not limited to all of those described in U.S. Pat. Nos. 7,064,472; 7,062,055; 7,052,594; 7,049,732; 7,034,432; 6,944,211; 6,911,764; 6,891,317; 6,882,086; and 6,876,135.

In general the actuator device comprises an actuator element as described herein connected to one or more electrodes (preferably compatible compliant or flexible electrodes). Compliant electrodes are known and described in, for example, U.S. Pat. Nos. 7,075,162; 6,876,125; 6,707,236; For example, an actuator element can be provided with a pair of electrodes, one on each side thereof. A more "tuned" response of the actuator element can be provided by connecting or operatively associating three or more electrodes with the actuator element at separate and spaced-apart locations thereon, so that a greater (or lesser) mechanical deformation of the actuator element is selectively achieved by selectively activating more (or less) of the electrodes. Electrodes, particularly flexible electrodes, can be connected to or associated with the actuator element by any suitable means, such as painting or coating and spraying the actuator element with an electrically conductive material in the desired locations, in accordance with known techniques. See, e.g., U.S. Pat. No. 7,075,162 to Unger.

Particular examples of electromechanical devices that can incorporate an actuator of the present invention include but are not limited to actuators per se, generators, sensors, robots, prosthetic limbs, motors, pumps, valves, toys, catheters, stents, manipulators, endoscopes, optical switches, etc. See, e.g., U.S. Pat. No. 7,049,732.

The present invention is explained in greater detail in the non-limiting examples set forth below.

EXPERIMENTAL

Two SEBS copolymers are described, hereafter referred to as SEBSM, where M denotes the number-average molecular weight of the copolymer in kDa.

Figure 2:
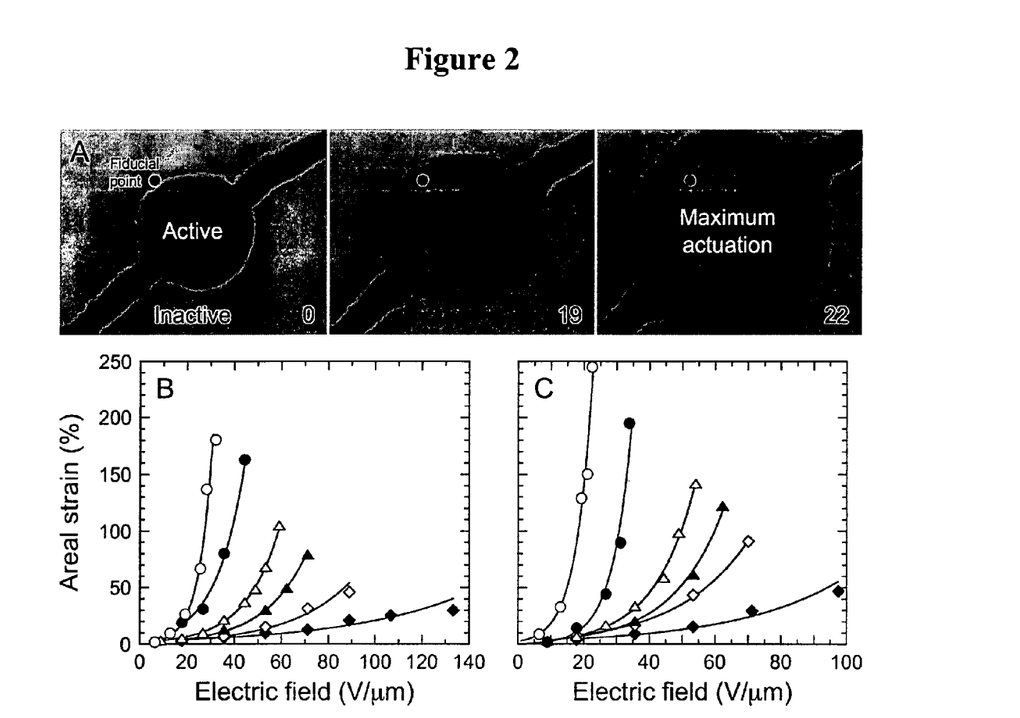
FIG. 2. In (A), a series of digital images showing the effect of electric field (listed values in V/μm) on areal activation in the ENP containing 5 wt % SEBS217. The dependence of areal actuation on electric field is provided in (B) and (C) for ENP systems composed of the SEBS161 and SEBS217 copolymers, respectively, at various concentrations (in wt %): 5 (○), 10 (●), 15 (Δ), 20 (▲), 25 (◇) and 30 (◆). The solid lines represent exponential fits to the data and serve as guides for the eye.

A sequence of digital images acquired from the active area of the network composed of 5 wt % SEBS217 copolymer upon exposure to electric fields varying in strength is shown in FIG. 2A and illustrates that the active region increases with increasing electric field, thereby confirming that the copolymer network exhibits an electromechanical response due to the development of a Maxwell stress. In this case, we refer to this class of EAPs as electroactive nanostructured polymers (ENPs) to reflect their supramolecular design. Analysis of images such as those displayed in FIG. 2A by the Matrox Inspector image analysis software package yields areal actuation strain values, which are provided as a function of applied electric field for ENPs containing the SEBS161 and SEBS217 copolymers at various concentrations in FIGS. 2B and 2C, respectively. Several important features are evident from these results. The first is that the areal actuation strain increases with increasing electric field, which is consistent with observations reported[18] for other dielectric EAPs. Another noteworthy feature is that the maximum areal actuation strain, measured at an electric field within <1% of the breakdown electric field (where failure occurs), increases with decreasing copolymer content and increasing copolymer molecular weight. Conversely, the breakdown field is found to decrease sharply with decreasing copolymer concentration and, to a lesser extent, increasing molecular weight. While the results presented in FIG. 2 correspond to single cycle, actuation cycling up to 100 cycles shows negligible hysteresis, as measured in terms of non-recoverable (areal) strain (~2.0% for the SEBS217 systems and 3.4-14% for the SEBS161 systems, depending on copolymer concentration) at applied fields ranging from 48 to 60% of the concentration-dependent breakdown fields. These conditions are representative of typical EAP applications.

Taken together, these results demonstrate that the field-induced strain of ENPs can be greatly enhanced by decreasing the viscosity of the matrix component and the extent of nanostructural order, while increasing the population of polarizable phenyl rings (i.e., increasing the mass of the S block). The former simply requires higher solvent loading insofar as network behavior is retained,[32] and the latter can be achieved by increasing the copolymer molecular weight. Comparison of the SEBS161 and SEBS217 copolymers reveals a difference of ~43% in the number of phenyl rings. Since the phenyl rings are largely immobilized due to nanoscale confinement within the glassy S-rich micelles that stabilize the ENP networks, they are not expected to individually respond to the applied electric field, although limited molecular reorientation may occur if the micelles are slightly plasticized due to low solvent inclusion. These networked micelles are presumed to cooperatively respond to the electric field, as illustrated in FIG. 1B, and thus promote lateral film displacement. Such supramolecular response, which is consistent with our observed non-hysteretic actuation cycling, has been previously reported[34] for comparable systems subjected only to high-strain tensile deformation with no applied electric field. Time-resolved synchrotron x-ray scattering further confirms that macroscopic deformation of these materials translates into either affine or nonaffine network deformation, depending on extension rate.[35] In similar fashion, Böker et al.[31] have likewise shown that the microphase-ordered nanostructural elements of concentrated block copolymer solutions align in the presence of an electric field.

Figure 3:
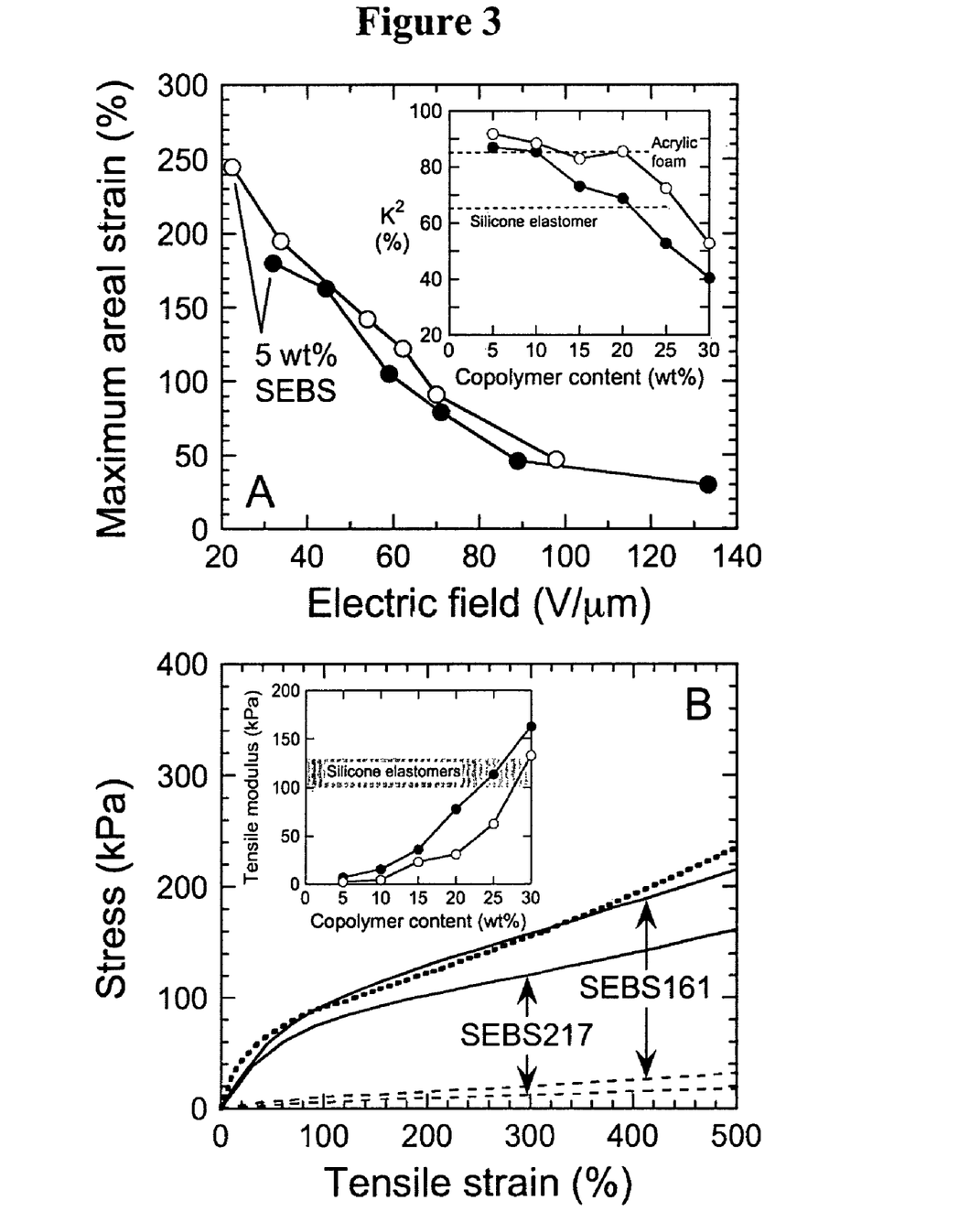

The dependence of the maximum areal actuation strain on electric field determined for ENPs in this study is provided in FIG. 3A and demonstrates that, unlike other dielectric EAPs, these ENPs exhibit a broad range of composition-tunable electromechanical behavior. An increase in copolymer molecular weight (i.e., the population of polarizable phenyl rings within each micelle) or, conversely, a reduction in copolymer concentration significantly improves actuation strain at low electric field in both ENP series.

The results of uniaxial tensile tests provided in FIG. 3B establish a relationship between the field-induced actuation and mechanical behavior of these materials. Widely ranging mechanical behavior can be systematically produced by varying copolymer molecular weight and ENP composition. The property range displayed in this figure can be extended further by either increasing the copolymer concentration beyond 30 wt % or using SEBS copolymers of comparable composition with a molecular weight less than 161 kDa or greater than 217 kDa. Similar tunability is observed for the tensile modulus (provided in the inset). Included for comparison in FIG. 3B are data obtained from the VHB 4910 acrylic foam.

The very high strains and strain energies at failure measured for these ENPs attest to the superior potential of solvated triblock copolymers as actuator materials. As expected, the highest maximum areal actuation strain levels and, thus, the highest energy densities (which constitute a measure of an actuator to perform work) are achieved with the lowest-modulus materials, namely, the ENPs containing 5-10 wt % SEBS217 copolymer. Collective results of this study are compared with discrete values for dielectric EAPs discussed elsewhere[1,9,14] in Table 1. This comparison illustrates that, although the ENP materials possess low-to-moderate energy densities (especially relative to ferroelectric polymers[36]), they nonetheless show exceptional electroactive behavior with composition-tunable properties. Relative to the VHB 4910 acrylic foam, for instance, the lowest-modulus ENPs reported here exhibit a 14-55% increase in maximum areal actuation strain at markedly lower breakdown electric fields (22-32 V/μm vs. 161V/μm). The increase in maximum areal strain is more pronounced with regard to the HS3 silicone elastomer (94-163%). Although Table 1 further reveals that the moduli measured from the two ENP series examined here are less than the moduli of the other EAPs, higher moduli are achievable at higher copolymer concentrations and lower copolymer molecular weights than those investigated here.

A related issue to be considered in the design of electroactive materials is mechanical hysteresis, since the target technologies requiring such materials impose cyclic deformation. As mentioned earlier, the VHB 4910 acrylic foam suffers from progressive hysteresis during cyclic deformation due to viscoelastic losses.[1] After 100 cycles to 400% strain at a fixed uniaxial extension rate of 500 mm/min, this EAP undergoes 38% non-recoverable strain due to permanent deformation. For direct comparison, strain-cycling tests have been performed under identical conditions to assess the mechanical hysteresis of the ENPs. While these ENPs generally exhibit relatively low non-recoverable strain upon cycling (<18%, with only the ENP containing 5 wt % SEBS161 prematurely failing after 65 cycles), hysteresis is virtually absent (~4%) in the most dilute SEBS217 system, which behaves as a model elastomer. The high elastic resilience of these ENPs suggests that these materials could enjoy incredibly long cycle lives as soft, reliable and robust actuators. Another measure of EAP performance is the electromechanical coupling factor ($K^2$), defined as the ratio of stored mechanical energy to input electrical energy and related to the thickness strain due to actuation ($s_r$) by[14]

$$K^2 = -2s_z - s_z^2 \qquad (2)$$

where $s_z = t_{act}/t_0 - 1$, and the film thicknesses before ($t_0$) and after ($t_{act}$) actuation are depicted in FIG. 1B. Measured values of $K^2$ are included in the inset of FIG. 3A and confirm that ENP efficacy extends over a broad range that includes the VHB 4910 acrylic foam and HS3 silicone elastomer. Note that these ENPs are not optimized to minimize the presence of defects, which can influence dielectric behavior.

Figure 4:
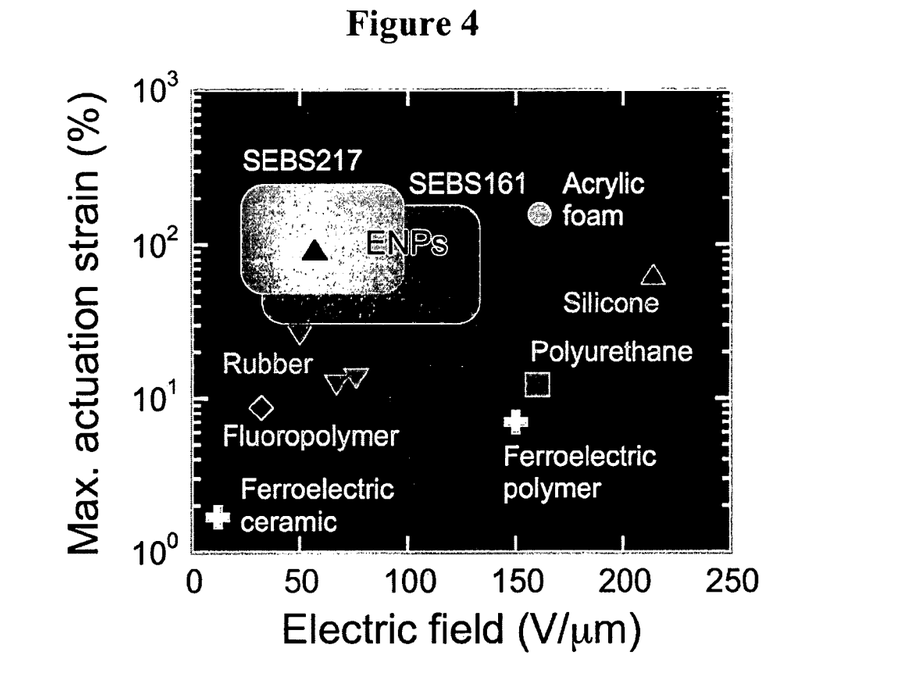
FIG. 4. Maximum actuation strain presented as a function of electric field for several promising classes of dielectric organic materials: an acrylic foam,[1] two silicone elastomers' (see Table 1), a ferroelectric polymer,[9] a single-crystal ferroelectric ceramic,[4] and the ranges of the two series of ENPs under investigation in this work (SEBS161, orange; SEBS217, blue). Values shown for polyurethane, as well as natural and synthetic rubber, are calculated from actuation measurements reported in refs. 41 and 42. Data displayed here for dielectric elastomers refer to areal strains, whereas linear strains are included for the two classes of ferroelectric materials. Since the ENPs afford ultrahigh displacement upon cyclic actuation, they constitute excellent physical models[40] for organisms that exhibit remarkable muscular resilience.
Figure 5:
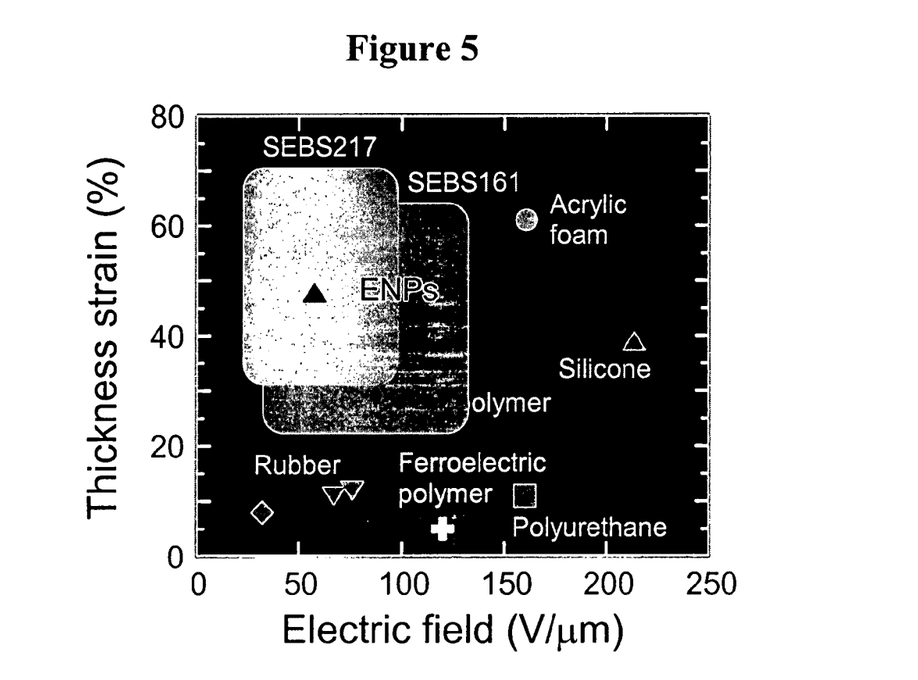

Since the ENPs reported here can be produced from a wide variety of starting materials including different block copolymers[37] and low-volatility selective solvents varying in chemical constitution, molecular weight and physical properties, the robust strategy described here, based on molecular self-assembly, constitutes a breakthrough to dielectric elastomers exhibiting ultrahigh displacement at relatively low electric fields. Direct comparison of the maximum areal actuation strains measured for the ENPs with other dielectric polymers is displayed in FIG. 4. Included in FIG. 4 are linear actuation strains reported for a ferroelectric polymer[9] and ceramic.[4] Thickness strains due to actuation corresponding to the polymeric systems portrayed in FIG. 4 are provided in FIG. 5. Although dielectric elastomers generally require much higher actuation voltages compared to other electroactive materials such as carbon nanotubes,[5] ionic polymer-metal composites[38] and conductive polymers,[39] they can achieve considerably greater (in some cases by more than two orders of magnitude) and wider ranging actuation displacements. In contrast to the other materials shown in FIGS. 4 and 5, the range over which ENPs exhibit electrical actuation is remarkably broad due to composition tunability and shifted to substantially higher displacements at reduced electric fields. These materials constitute ideal candidates for high-precision and high-strain electromechanical applications such as microrobotics, biomedical devices (e.g., steerable catheters) and active Braille or haptic interfaces, as well as physical models[40] for biological organisms that exhibit tremendous muscular resilience.

Materials and Methods. Two series of triblock copolymer networks were prepared by incorporating an aliphatic/alicyclic white mineral oil (Witco Hydrobrite 380, Crompton Corp., Petrolia, Pa.) into two SEBS copolymers (Kraton, GLS Corporation, McHenry, Ill.) varying in number-average molecular weight (161 and 217 kDa) and, to a lesser extent, composition (31-33 wt % S). Systems ranging in concentration from 5 to 30 wt % SEBS in 5 wt % increments were produced by mixing the copolymer, EB-selective solvent and 1 wt % antioxidant for 30 min in a Ross LDM double-planetary mixer under vacuum at 180° C. Portions of the resultant materials were compression-molded at 180° C. and then slowly cooled to ambient temperature,[32] yielding films 1.8-2.5 mm thick (note thickness can be tuned depending upon the requirements for the particular application). The film thickness can be controllably altered to meet the demands of a given application. Since the actuation response of elastomeric materials is strongly influenced by their mechanical properties, we performed quasi-static uniaxial tensile tests to discern the stress-strain behavior of the copolymer systems under investigation as functions of copolymer molecular weight and concentration. The films were then evaluated for their electric field-induced actuation under 300% biaxial prestrain in the well-known circular test configuration to permit direct comparison with existing EAPs.[1] Prestrain was necessary to reduce film thickness and, thus, the electrical potential required for actuation. A small circular active area in each prestrained test specimen (identified in FIG. 2A) was created by applying compliant electrodes composed of Ag grease (Chemtronics Circuit Works, Kennesaw, Ga.) on both sides of the film.

TABLE 1

Actuation Behavior of ENPs Varying in Composition and Other Dielectric EAPs[a]

| System | Polymer fraction (wt %) | Lateral prestrain (x %, y %) | Tensile modulus (kPa) | Maximum areal strain (%) | Maximum thickness strain (%) | Breakdown electric field (V/μm) | Energy density[b] (kJ/m³) |
|---|---|---|---|---|---|---|---|
| VHB 4910 | | | | | | | |
| Acrylic foam | 100 | 300, 300[c] | 1000-3000[d] 200[e] | 158[c] | 61[c] | 161[f] | 3400[c] |
| HS3 | | | | | | | |
| Silicone Elastomer CF19-2186 | 100 | 68, 68[c] | 130[f] | 93[c] | 48[c] | 57[f] | 98[c] |
| Silicone Elastomer | 100 | 45, 45[c] | 100[g] | 64[c] | 39[c] | 214[f] | 750[c] |

TABLE 1-continued

Actuation Behavior of ENPs Varying in Composition and Other Dielectric EAPs[a]

| System | Polymer fraction (wt %) | Lateral prestrain (x %, y %) | Tensile modulus (kPa) | Maximum areal strain (%) | Maximum thickness strain (%) | Breakdown electric field (V/μm) | Energy density[b] (kJ/m$^3$) |
|---|---|---|---|---|---|---|---|
| ENP[e] | | | | | | | |
| SEBS161 | 5-30 | 300, 300 | 7-163 | 180-30 | 64-22 | 32-133 | 137-140 |
| SEBS217 | 5-30 | 300, 300 | 2-133 | 245-47 | 71-31 | 22-98 | 119-130 |

[a]Electric fields reported here are expressed relative to the pre-actuation film thickness after biaxial pre-straining ($t_0$ in FIG. 1B), unless otherwise specified. Applied voltages used in conjunction with the ENPs are calculated by multiplying the electric field by $t_0$ (0.16 or 0.11 mm for ENPs with 5 or 10-30 wt % copolymer, respectively). Corresponding solvent fractions (in wt %) of the ENPs can be determined from (99 − polymer fraction), which accounts for 1 wt % added antioxidant.
[b]Energy density values are based on the actual film thickness upon actuation ($t_{act}$ in FIG. 1B).
[c]Reported in ref. 1.
[d]Reported in ref. 9.
[e]Measured in this work.
[f]Values reported in ref. 1 are determined from $t_{act}$. For an equitable comparison with respect to $t_0$, the electric field values measured in ref. 1 are multiplied by $(1 + s_2)$.
[g]Reported in ref. 14.

REFERENCES

1. Pelrine, R., Kornbluh, R., Pei, Q. & Joseph, J. High-speed electrically actuated elastomers with strain greater than 100%. *Science* 287, 836-839 (2000).
2. Cho, A. Stretching Horizons for Electrical Devices. *Science* 287, 783-785 (2000).
3. Zhang, Q. M., Bharti, V. & Zhao, X. Giant electrostriction and relaxor ferroelectric behavior in electron-irradiated poly(vinylidene fluoride-trifluoroethylene) copolymer. *Science* 280, 2101-2104 (1998).
4. Park, S.-E. & Shrout, T. R. Ultrahigh strain and piezoelectric behavior in relaxor based ferroelectric single crystals. *J. Appl. Phys.* 82, 1804-1811 (1997).
5. Baughman, R. H., Cui, C. X., Zakhidov, A. A., Iqbal, Z., Barisci, J. N., Spinks, G. M., Wallace, G. G., Mazzoldi, A., De Rossi, D., Rinzler, A. G., Jaschinski, O., Roth, S. & Kertesz, M. Carbon nanotube actuators. *Science* 284, 1340-1344 (1999).
6. Gu, G., Schmid, M., Chiu, P. W., Minett, A., Fraysse, J., Kim, G. T., Roth, S., Kozlov, M., Munoz, E. & Baughman, R. H. V$_2$O$_5$ nanofibre sheet actuators. *Nature Mater.* 2, 316-319 (2003).
7. Funakubo, H. (ed.), *Shape Memory Alloys* (Gordon and Breach, New York, 1987).
8. Zhang, Q. M., Li, H. F., Poh, M., Xia, F., Cheng, Z. Y., Xu, H. S. & Huang, C. An all-organic composite actuator material with a high dielectric constant. *Nature* 419, 284-287 (2002).
9. Madden, J. D. W., Vandesteeg, N. A., Anquetil, P. A., Madden, P. G. A., Takshi, A., Pytel, R. Z., Lafontaine, S. R., Wieringa, P. A. & Hunter, I. W. Artificial muscle technology: physical principles and naval prospects. *IEEE J. Oceanic Eng.* 29, 706-728 (2004).
10. Baughman, R. H. Materials Science: Playing nature's game with artificial muscles. *Science* 308, 63-65 (2005).
11. Berdichevsky, Y. & Lo, Y. H. Polypyrrole nanowire actuators. *Adv. Mater.* 18, 122-125 (2006).
12. Yamwong, T., Voice, A. M. & Davies, G. R. Electrostrictive response of an ideal polar rubber. *J. Appl. Phys.* 91, 1472-1476 (2002).
13. Yao, L. & Krause, S. Electromechanical responses of strong acid polymer gels in DC electric fields. *Macromolecules* 36, 2055-2065 (2003).
14. Kornbluh, R., Pelrine, R., Joseph, J., Heydt, R., Pei, Q. & Chiba, S. High-field electrostriction of elastomeric polymer dielectrics for actuation. *Proc. SPIE* 3669, 149-161 (1999).
15. Pelrine, R., Kornbluh, R. & Kofod, G. High-strain actuator materials based on dielectric elastomers. *Adv. Mater.* 12, 1223-1225 (2000).
16. Ma, W. & Cross, L. E. An experimental investigation of electromechanical response in a dielectric acrylic elastomer. *Appl. Phys. A* 78, 1201-1204 (2004).
17. Bar-Cohen, Y. (ed.), *Electroactive Polymer (EAP) Actuators as Artificial Muscles: Reality, Potential, and Challenges,* 2$^{nd}$ ed. (SPIE Press, Bellingham, Wash., 2004).
18. Kofod, G. & Sommer-Larsen, P. Silicone dielectric elastomer actuators: Finite-elasticity model of actuation. *Sens. Actuator A* 122, 273-283 (2005).
19. Morkved, T. L., Lu, M., Urbas, A. M., Ehrichs, E. E., Jaeger, H. M., Mansky, P. & Russell, T. P. Local control of microdomain orientation in diblock copolymer thin films with electric fields. *Science* 273, 931-933 (1996).
20. Böker, A., Elbs, H., Hansel, H., Knoll, A., Ludwigs, S., Zettl, H., Urban, V., Abetz, V., Muller, A. H. E. & Krausch, G. Microscopic mechanisms of electric-field-induced alignment of block copolymer microdomains. *Phys. Rev. Lett.* 89, Article No. 135502 (2002).
21. Xu, T., Zvelindovsky, A. V., Sevink, G. J. A., Lyakhova, K. S., Jinnai, H. & Russell, T. P. Electric field alignment of asymmetric diblock copolymer thin films. *Macromolecules* 38, 10788-10798 (2005).
22. Amundson, K., Helfand, E., Quan, X. N., Hudson, S. D. & Smith, S. D. Alignment of lamellar block copolymer microstructure in an electric field. 2. Mechanisms of alignment. *Macromolecules* 27, 6559-6570 (1994).
23. Park, C., Yoon, J. & Thomas, E. L. Enabling nanotechnology with self assembled block copolymer patterns. *Polymer* 44, 6725-6760 (2003).
24. Hamley, I. W. *The Physics of Block Copolymers* (Oxford University Press, New York, 1998).
25. Bates, F. S. & Fredrickson, G. H. Block copolymers—designer soft materials. *Phys. Today* 52, 32 (1999).
26. Alexandridis, P. & Spontak, R. J. Solvent-Regulated Ordering in Block Copolymers. *Curr. Opin. Coll. Interface Sci.* 4, 130 (1999).
27. Discher, D. E. & Eisenberg, A. Polymer vesicles. *Science* 297, 967-973 (2002).
28. Jain, S. & Bates, F. S. On the origins of morphological complexity in block copolymer surfactants. *Science* 300, 460-464 (2003).
29. Spontak, R. J. & Patel, N. P. in *Developments in Block Copolymer Science and Technology,* Hamley, I. W. (ed.) (Wiley, New York, 2004).

30. Cavicchi, K. A., Berthiaume, K. J. & Russell, T. P. Solvent annealing thin films of poly(isoprene-b-lactide). *Polymer* 46, 11635-11639 (2005).
31. Böker, A., Elbs, H., Hansel, H., Knoll, A., Ludwigs, S., Zettl, H., Zvelindovsky, A. V., Sevink, G. J. A., Urban, V., Abetz, V., Muller, A. H. E. & Krausch, G. Electric field induced alignment of concentrated block copolymer solutions. *Macromolecules* 36, 8078-8087 (2003).
32. Laurer, J. H., Mulling, J. F., Khan, S. A., Spontak, R. J. & Bukovnik, R. Thermoplastic elastomer gels. I. Effects of composition and processing on morphology and gel behavior. *J. Polym. Sci. B: Polym. Phys.* 36, 2379-2391 (1998).
33. Cheng, L.-T., Tam, W., Marder, S. R., Stiegman, A. E., Rikken, G. & Spangler, C. W. Experimental investigations of organic molecular nonlinear optical polarizabilities. 2. A study of conjugation dependences. *J. Phys. Chem.* 95, 10643-10652 (1991).
34. Prasman, E. & Thomas, E. L. High-strain tensile deformation of a sphere-forming triblock copolymer/mineral oil blend. *J. Polym. Sci. B: Polym. Phys.* 36, 1625-1636 (1998).
35. Kleppinger, R., van Es, M., Mischenko, N., Koch, M. H. J. & Reynaers, H. Physical gelation in a triblock copolymer solution: in situ study of stress-strain behavior and structural development. *Macromolecules* 31, 5805-5809 (1998).
36. Chu, B. J., Zhou, X., Ren, K. L., Neese, B., Lin, M. R., Wang, Q., Bauer, F. & Zhang, Q. M. A dielectric polymer with high electrical energy density and fast discharge speed. *Science* 313, 334-336 (2006).
37. Laurer, J. H., Khan, S. A., Spontak, R. J., Satkowski, M. M., Grothaus, J. T., Smith, S. D. & Lin, J. S. Morphology and rheology of SIS and SEPS triblock copolymers in the presence of a midblock-selective solvent. *Langmuir* 15, 7947-7955 (1999).
38. Nemat-Nasser, S. & Wu, Y. X. Comparative experimental study of ionic polymer-metal composites with different backbone ionomers and in various cation forms. *J. Appl. Phys.* 93, 5255-5267 (2003).
39. Bay, L., West, K., Sommer-Larsen, P., Skaarup, S. & Benslimane, M. A conducting polymer artificial muscle with 12% linear strain. *Adv. Mater.* 15, 310-313 (2003).
40. Bar-Cohen, Y. (ed.) *Biomimetics: Biologically Inspired Technologies* (CRC Press/Taylor & Francis, Boca Raton, Fla., 2005).
41. Pelrine, R., Kornbluh, R., Joseph, J., Heydt, R., Pei, Q. B. & Chiba, S. High-field deformation of elastomeric dielectrics for actuators. *Mater. Sci. Eng. C* 11, 89-100 (2000).
42. Choi, H. R., Jung, K. M., Koo, J. C., Do Nam, J., Lee, Y. K. & Cho, M. S. Electrostatically driven soft polymer actuator based on dielectric elastomer. *Key Eng. Mater.* 297-300, 622-627 (2005).

The foregoing is illustrative of the present invention, and is not to be construed as limiting thereof. The invention is defined by the following claims, with equivalents of the claims to be included therein.

That which is claimed is:

1. A transducer useful in an electromechanical device, said transducer comprising:
    (a) at least one electrode; and
    (b) an actuator element operatively associated with said at least one electrode, said actuator element formed from an actuator composition comprising: (i) at least one thermoplastic elastomer copolymer, said copolymer comprising at least one flexible midblock and at least two glassy or semicrystalline endblocks; and (ii) at least one organic solvent that selectively solvates said at least one flexible midblock.

2. The transducer of claim 1, wherein said flexible midblock is a polyolefin or polydiene midblock.

3. The transducer of claim 1, wherein said flexible midblock is selected from the group consisting of: ethylene-co-butylene, ethylene-co-propylene, ethylene-ethylene-co-propylene, isoprene, butadiene, and derivatives thereof.

4. The transducer of claim 1, wherein said endblocks are aromatic or acrylic endblocks.

5. The transducer of claim 1, wherein said endblocks are selected from the group consisting of styrene endblocks, methacrylate endblocks, and derivatives thereof.

6. The transducer of claim 1, wherein said copolymer is selected from the group consisting of:
    poly[styrene-b-(ethylene-co-butylene)-b-styrene] (SEBS);
    poly[styrene-b-(ethylene-co-propylene)-b-styrene] (SEPS);
    poly[styrene-b-(ethylene-ethylene-co-propylene)-b-styrene] (SEEPS);
    poly(styrene-b-isoprene-b-styrene) (SIS); poly(styrene-b-butadiene-b-styrene) (SBS);
    and derivatives thereof.

7. The transducer of claim 1, wherein said solvent is an oil having a boiling point greater than 50° C.

8. The transducer of claim 1, wherein said actuator element is formed by molding, extruding, or casting.

9. The transducer of claim 1, wherein said actuator composition comprises a thermoplastic elastomer gel.

10. The transducer of claim 1, wherein:
    said thermoplastic elastomer has a molecular weight greater than 10,000;
    said solvent has a molecular weight less than 10,000;
    said thermoplastic elastomer is included in said actuator composition in an amount of from 2 to 80 percent by weight; and
    said solvent is included in said actuator composition in an amount of from 98 to 2 percent by weight.

11. An electromechanical device comprising a transducer of claim 1.

12. The electromechanical device of claim 11, wherein said device is an actuator, generator, sensor, robot, prosthetic limb, motor, pump, valve, toy, catheter, or stent.

13. A transducer useful in an electromechanical device, said transducer comprising:
    (a) at least one electrode; and
    (b) an actuator element operatively associated with said at least one electrode, said actuator element formed from an actuator composition comprising: (i) at least one thermoplastic elastomer copolymer, said copolymer comprising at least one flexible midblock and at least two glassy or semicrystalline endblocks; and (ii) at least one organic solvent that selectively solvates said at least one flexible midblock; wherein:
    said flexible midblock is a polyolefin or polydiene midblock;
    said endblocks are aromatic or acrylic endblocks;
    said solvent is an oil having a boiling point greater than 50° C.;
    said actuator composition comprises a thermoplastic elastomer gel;
    said thermoplastic elastomer has a molecular weight greater than 10,000;
    said solvent has a molecular weight less than 10,000;

said thermoplastic elastomer is included in said actuator composition in an amount of from 2 to 80 percent by weight; and said solvent is included in said actuator composition in an amount of from 98 to 2 percent by weight.

14. The transducer of claim 13, wherein said flexible midblock is selected from the group consisting of: ethylene-co-butylene, ethylene-co-propylene, ethylene-ethylene-co-propylene, isoprene, butadiene, and derivatives thereof.

15. The transducer of claim 13, wherein said endblocks are selected from the group consisting of styrene endblocks, methacrylate endblocks, and derivatives thereof.

16. The transducer of claim 13, wherein said copolymer is selected from the group consisting of:
   poly[styrene-b-(ethylene-co-butylene)-b-styrene] (SEBS);
   poly[styrene-b-(ethylene-co-propylene)-b-styrene] (SEPS);
   poly[styrene-b-(ethylene-ethylene-co-propylene)-b-styrene] (SEEPS);
   poly(styrene-b-isoprene-b-styrene) (SIS); poly(styrene-b-butadiene-b-styrene) (SBS);
   and derivatives thereof.

17. The transducer of claim 13, wherein said actuator element is formed by molding, extruding, or casting.

18. An electromechanical device comprising a transducer of claim 13.

19. The electromechanical device of claim 18, wherein said device is an actuator, generator, sensor, robot, prosthetic limb, motor, pump, valve, toy, catheter, or stent.

20. An actuator element formed from an actuator composition, said composition comprising: (i) at least one thermoplastic elastomer copolymer, said copolymer comprising at least one flexible midblock, and at least two glassy or semi-crystalline endblocks; and (ii) at least one organic solvent that selectively solvates said at least one flexible midblock.

21. The actuator element of claim 20, wherein said flexible midblock is a polyolefin or polydiene midblock.

22. The actuator element of claim 20, wherein said flexible midblock is selected from the group consisting of: ethylene-co-butylene, ethylene-co-propylene, ethylene-ethylene-co-propylene, isoprene, butadiene, and derivatives thereof.

23. The actuator element of claim 20, wherein said endblocks are aromatic or acrylic endblocks.

24. The actuator element of claim 20, wherein said endblocks are selected from the group consisting of styrene endblocks, methacrylate endblocks, and derivatives thereof.

25. The actuator element of claim 20, wherein said copolymer is selected from the group consisting of:
   poly[styrene-b-(ethylene-co-butylene)-b-styrene] (SEBS);
   poly[styrene-b-(ethylene-co-propylene)-b-styrene] (SEPS);
   poly[styrene-b-(ethylene-ethylene-co-propylene)-b-styrene] (SEEPS);
   poly(styrene-b-isoprene-b-styrene) (SIS); poly(styrene-b-butadiene-b-styrene) (SBS);
   and derivatives thereof.

26. The actuator element claim 20, wherein said solvent is an oil having a boiling point greater than 50° C.

27. The actuator element of claim 20, wherein said actuator element is formed by molding, extruding, or casting.

28. The actuator element of claim 20, wherein said actuator composition comprises a thermoplastic elastomer gel.

29. The actuator element of claim 20, wherein:
   said thermoplastic elastomer has a molecular weight greater than 10,000;
   said solvent has a molecular weight less than 10,000;
   said thermoplastic elastomer is included in said actuator composition in an amount of from 2 to 80 percent by weight; and
   said solvent is included in said actuator composition in an amount of from 98 to 2 percent by weight.

* * * * *

UNITED STATES PATENT AND TRADEMARK OFFICE
CERTIFICATE OF CORRECTION

PATENT NO.       : 7,956,520 B2
APPLICATION NO.  : 12/515761
DATED            : June 7, 2011
INVENTOR(S)      : Shankar et al.

It is certified that error appears in the above-identified patent and that said Letters Patent is hereby corrected as shown below:

In the Patent:

Column 1, Line 64, (1): Please correct "$\sigma_M = \epsilon_0 \epsilon E^2$" to read -- $\sigma_M = \varepsilon_0 \varepsilon E^2$ --

Line 65: Please correct "where $\epsilon_0$" to read -- where $\varepsilon_0$ -- and correct "$\epsilon$ corresponds" to read -- $\varepsilon$ corresponds --

Column 3, Line 63: Please correct "elastomers'" to read -- elastomers[1] --

Column 9, Line 21, (2): Please correct "$s_r$" to read -- $s_z$ --

Signed and Sealed this
Eleventh Day of October, 2011

David J. Kappos
*Director of the United States Patent and Trademark Office*